United States Patent [19]

Lee

[11] Patent Number: 4,661,926
[45] Date of Patent: Apr. 28, 1987

[54] BIT LINE GAIN CIRCUIT FOR READ ONLY MEMORY

[75] Inventor: Robert D. Lee, Denton, Tex.

[73] Assignee: Thomson Components-Mostek Corp., Carrollton, Tex.

[21] Appl. No.: 674,103

[22] Filed: Nov. 20, 1984

[51] Int. Cl.⁴ .............................................. G11C 17/00
[52] U.S. Cl. ..................................... 365/104; 365/189
[58] Field of Search .............. 365/104, 230, 205, 207, 365/208, 189, 94, 103; 307/530

[56] References Cited

U.S. PATENT DOCUMENTS 4,281,397  7/1981  Neal et al. ........................... 365/189
4,348,596  9/1982  Atherton et al. ................... 307/530
4,388,705  6/1983  Sheppard .............................. 365/208

OTHER PUBLICATIONS

Wilson, "Cell Layout Boosts Speed of Low Power 64K ROM", *Electronics*, Mar. 30, 1978, pp. 96–99.

Primary Examiner—James W. Moffitt
Assistant Examiner—Glenn A. Gossage
Attorney, Agent, or Firm—Roland Plottel

[57] ABSTRACT

A ROM memory circuit featuring a bit line gain circuit to the output thereof, effective for establishing isolation of bit and output lines, reduction of bit line voltage swing, VREF level tracking and bit line select circuitry performing a logical OR between two adjacent column select signals with no more than three transistors and effective for generation of a sinking current to maximize the slew rate of the output signal nodes.

3 Claims, 10 Drawing Figures

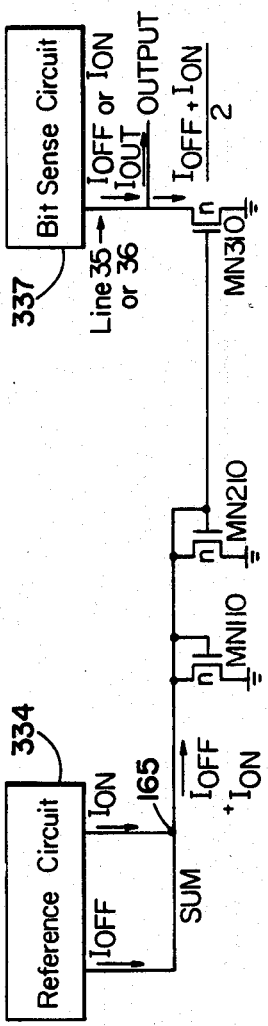
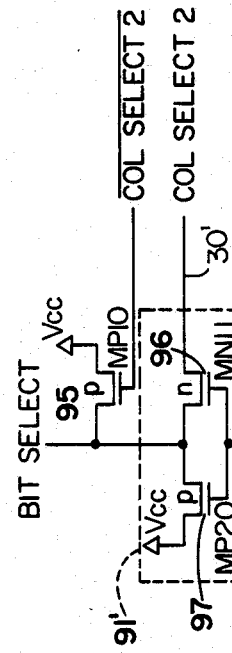
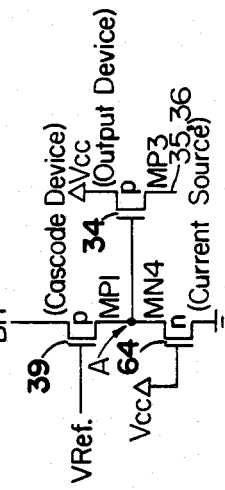
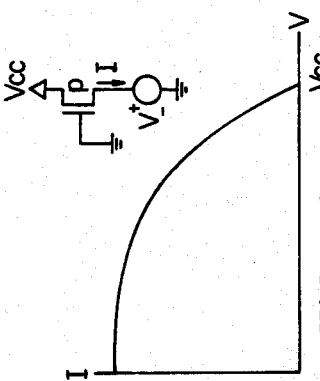
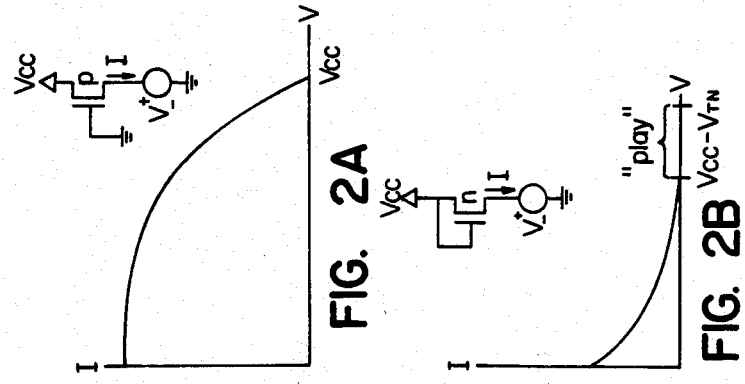
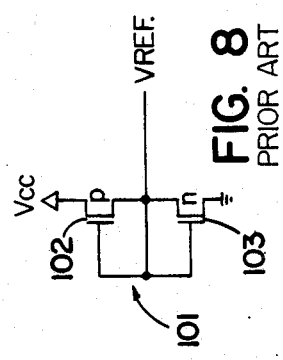
FIG. 6
FIG. 3
FIG. 7
FIG. 2A
FIG. 2B
FIG. 8 PRIOR ART

BIT LINE GAIN CIRCUIT FOR READ ONLY MEMORY

TECHNICAL FIELD

This invention is directed toward the field of semiconductor memories, in particular read only memories (ROMs).

BACKGROUND ART

Mostek MK 36000 and MK 38000 chips are prior art with regard to this invention. These chips are n-channel silicon gate metal oxide silicon (MOS) 64K-bit read only memories (ROMs) organized respectively in 8192 words by eight bits and 32,768 words by eight bits.

In the MK36000 device, static storage cells with clocked control permit the circuit to be put into an automatic low power standby mode, reducing power dissipation to typically 35 mW. Chip operation is edge activated which permits greater system flexibility and an increase in system speed. The MK38000 device provides maximum circuit density while maintaining low power dissipation.

These memories both are arranged as an array of cells, which may be configured in an "x-cell" format. This array comprises a plurality of row leads each connected at a plurality of points to the gates of a corresponding plurality of MOS transistors. Orthogonal to these rowlines are a plurality of connecting said plurality of transistors at their respective source and drains.

To determine the state of a given transistor in the array—that is to read or access the transistor its row is first taken high, its column line is pulled low while all other column lines are maintained high, the bit lines adjacent the low column line are inspected for current passage. If no current flow is detected, the transistor is deemed to have been in high state.

This sensing scheme of course views conditions at two adjacent transistors. In prior art n-channel ROMs, each bit and column line is attached to $V_{cc}$ through an n-channel transistor having its gate also attached to $V_{cc}$. Column select is accomplished by turning on associated n-channel transistors.

By setting column select high, the selected column goes low and the pass transistors are enabled to pass data from the bit lines to the output lines. Accordingly, the selected transistor in the memory array must slew both the bit line, the pass transistor and the particular output line.

DISCLOSURE OF THE INVENTION

According to the invention, a gain stage is introduced between the bit lines and output lines of a ROM transistor array, reducing the slew duty of each of the transistors to only the bit line. The gain stage comprises a cascode amplifier subject to a selected reference voltage and driving the gate of the p-channel transistor in turn drain driving an output line.

Further according to the invention, the ROM transistor array employs p-channel devices for clamping the outputs of the array to the sense amplifier.

Further according the invention, the selected reference voltage driving the gate of said cascode amplifier is applied by an inverter with its output shorted to its input.

Even further according to the invention, the ROM memory circuits includes bit select circuitry performing a logical OR between two adjacent column select signal.

According to even another version of the invention, a reference voltage is generated with first and second CMOS transistors, connected as an inverter with its output shorted to its input and comprising an enable means for disconnecting the gates of said transistors from the node of connection. The enable means can include a means for isolating this node, and a means for enhancing the slew rate of the node.

BRIEF DESCRIPTION OF THE DRAWING

FIGS. 2A and 2B are respectively graphs of current drawn by a bit line in the ROM transistor array versus voltage for respectively p-channel and n-channel pull-up transistors;

FIG. 3 is a detail of the bit select circuitry more generally suggested in FIG. 1;

FIG. 6 is a bit sense circuit for drawing currents ION or IOFF;

FIG. 7 is a circuit arrangement for applying VREF to the output lines;

FIG. 8 is a circuit according to the prior art for establishing a voltage reference level VREF.

BEST MODE FOR CARRYING OUT THE INVENTION

Figure 1:
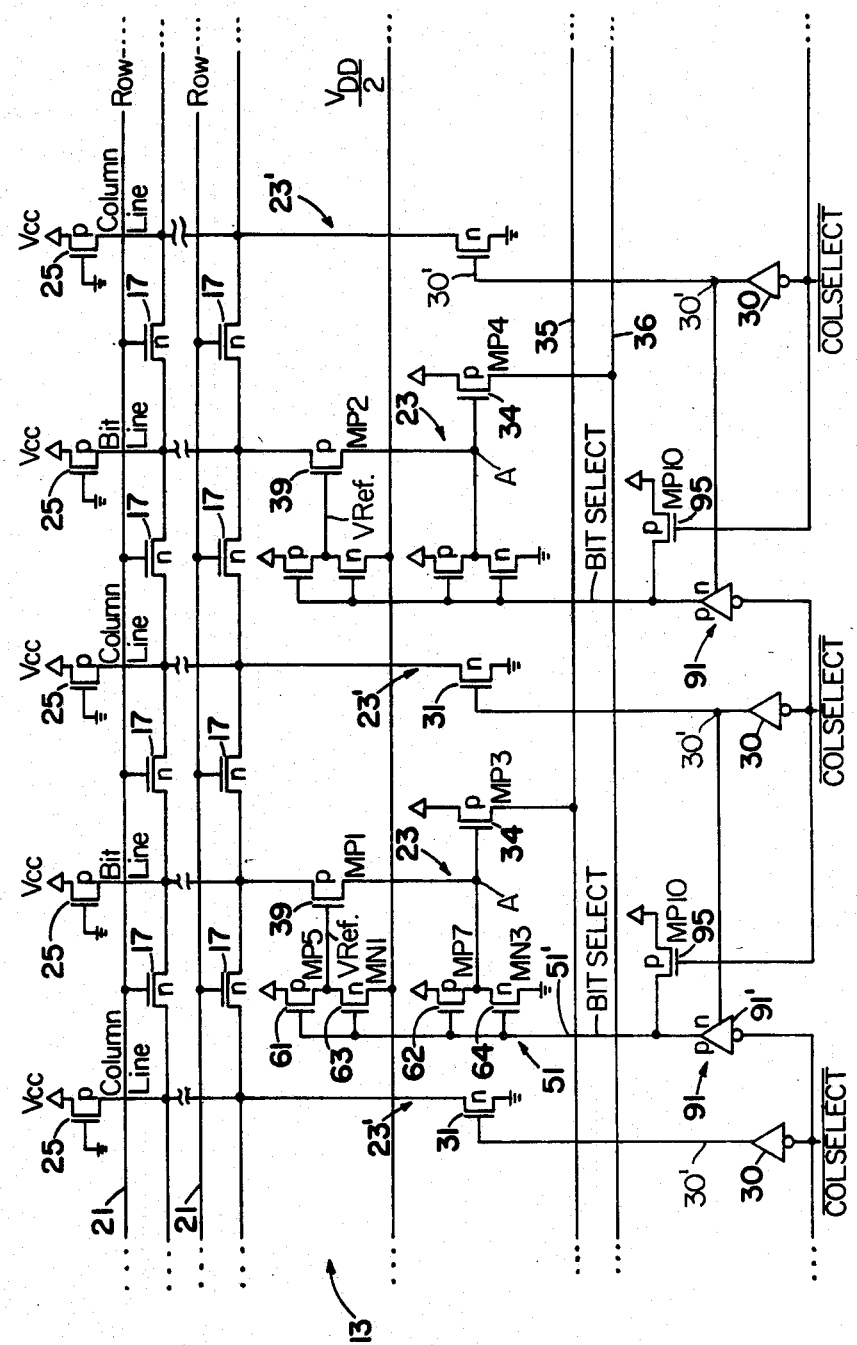
FIG. 1 is a circuit drawing of a ROM transistor array according to the invention herein, including p-channel pull-up transistors.

FIG. 1 shows a ROM transistor array 13 comprising a plurality of MOS transistors 17 (preferably n-channel in type) arranged between row lines 21, column lines 23' and bit lines 23.

The column and bit lines respectively 23' and 23 are connected to Vcc through gate-grounded p-channel MOS pull-up transistors 25. Each of column lines 23' can in turn be grounded subject to a column select signal "COLSELECT" applied through inverters 30 to the gate of one of n-channel MOS transistors 31.

As FIGS. 2A and 2B show, the connection to $V_{cc}$ through a gate-grounded p-channel transistor 25 (FIG. 2A) is preferable to a $V_{cc}$ source-follower n-channel transistor, because it provides better clamping than an n-channel transistor (FIG. 2B). This is a fact, because there is no $V_t$ play between $V_{cc}$ and the turn-on voltage of the transistor 25 when it is a p-channel device.

FIG. 1 further shows a gain stage 34 between each bitline 23 and one of first and second output lines respectively 35 and 36. As a result of this gain stage 34, the selected transistor 17 must slew only the bitline 23, and not output line 35 or 36, as the case may be. Additionally, voltage sensing of the bitlines 23 need not be as substantial. This considerably enhances the speed of the arrangement.

FIG. 1 additionally shows bit select circuitry 51 which enables the current sources on each side of the column line 23' selected. When a bitline 23 is selected, a BITSELECT signal on line 51' goes high, turning off transistors MP5 and MP7, respectively 61 and 62. Thus, transistor 63 (MN1) will pass VREF to the gate of transistor 39 (MP1), enabling its operation as a cascode amplifier. Transistor 64 (MN3) additionally will turn on, providing a pull-down current for cascode device MP1 (so termed because the source rather than the gate is driven), transistor 39. Thus, the gate of MP3, transistor 34, will be dropped to the value determined by the transistor accessed, driving the gain stage, and MP3 will pass the data to output line 35 for example. By deselecting bitline 51', MP5 and MP7 are set "on", effectively turning off MP1 and MP3.

FIG. 1 further shows select circuitry 91 to set high bit lines 23 straddling a selected column line 23' when column select goes high. In other words, BITSELECT is high for a given bitline 23 when one or the other COLSELECT adjacent bitline 23 is high. Thus, BITSELECT is an OR function of adjacent COLSELECT.

This OR function is conventionally implemented using six transistors. However, as shown in FIG. 3, only three transistors 95, 96 and 97 respectively MP10, MN11 and MP20 need to be used to establish an OR function according to the invention herein. Transistors MN11 and MP20 can be represented as an inverter 91'. Thus, select circuitry 91 includes inverter 91' and transistor 95 (MP10).

Since only one COLSELECT can be high at any given time, selecting a given COLSELECT and thus setting it high implies that each adjacent COLSELECT is low. If the COLSELECT to the gate of p-channel transistor 95 (MP10) is high, then MP10 is off. At the same time, adjacent COLSELECTs at the input of inverter 91' would be low, causing MP20 to be on and MN11 to be off. Then BITSELECT on line 51' is high.

Similarly, if on the other hand, the COLSELECT at the gate of p-channel transistor 95 (MP10) is low instead, and that the adjacent COLSELECT at the input inverter 91' is high, then MP20 is off, MN11 is on with its drain at $V_{cc}$ and MP10 is on, causing BITSELECT to be set high.

However, if both adjacent COLSELECTs are low, (and thus the $\overline{COLSELECT}$s are high) then MP10 and MP20 are both off, and MN11 is on, pulling BITSELECT to the low value of COLSELECT.

As a result, the following Table I holds true:

| COLSELECT | ADJACENT COLSELECT | BITSELECT |
|---|---|---|
| 0 | 0 | 0 |
| 0 | 1 | 1 |
| 1 | 0 | 1 |
| 1 | 1 | n/a |

This can be expressed according to the relationship: BITSELECT = COLSELECT + ADJACENT COLSELECT.

Figure 4:
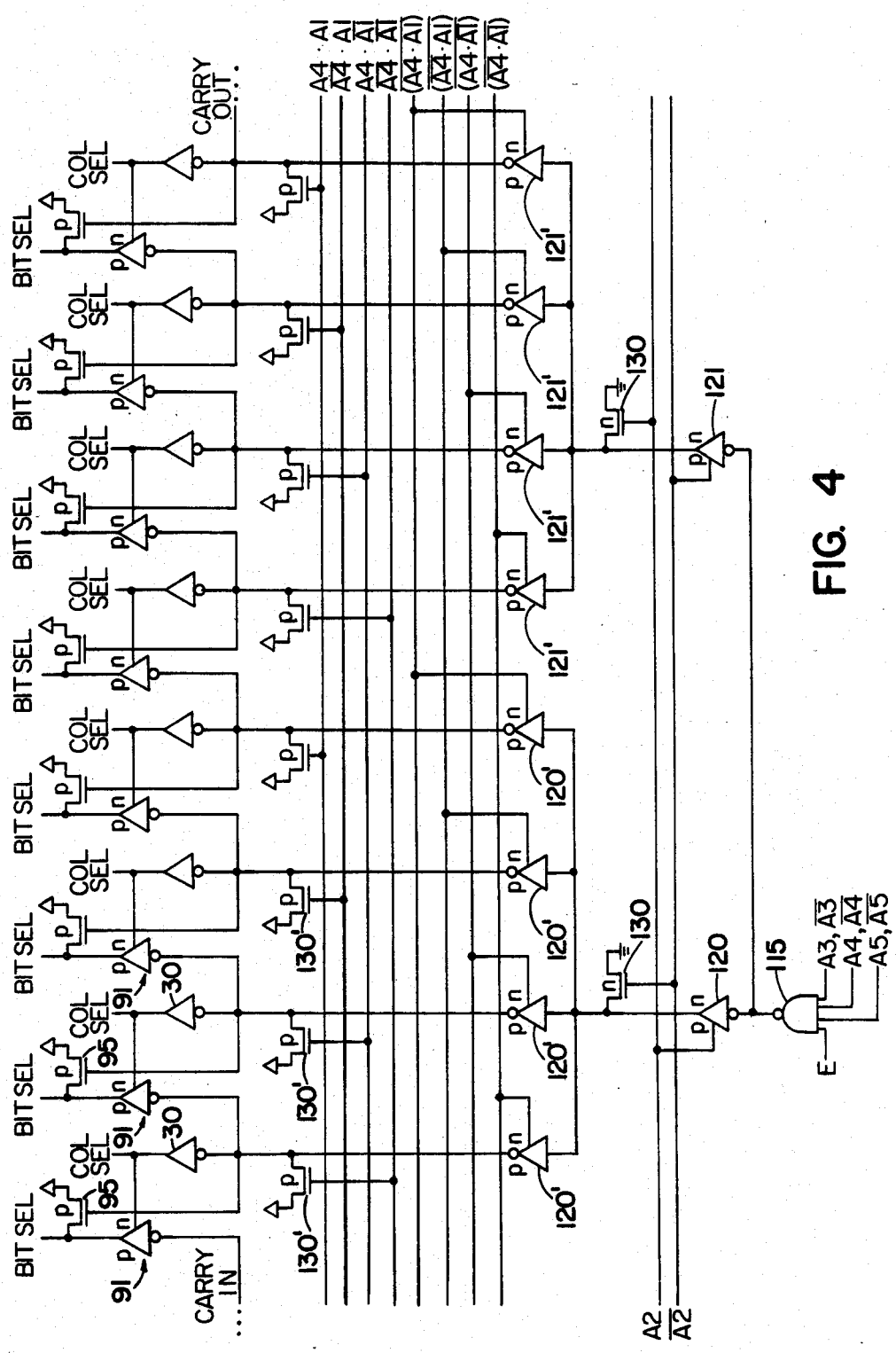
FIG. 4 is a one of sixty-four decode of column address signals arrangment to develop COLSELECT signals from COLUMN address signals, according to the invention herein.

COLSELECT can for example be a one of sixty-four decode of column address signals, or more generally a one of $2^n$ decode thereof. In particular, FIG. 4 shows how to develop COLSELECT signals from COLUMN address signals. More particularly, the Figure shows a one of eight decode arrangement which can be stepped eight times to form a one of 64 decode. The Figure shows NAND gate 115 including an enable input E as well as address inputs $\overline{A3}$, A3, $\overline{A4}$, A4, $\overline{A5}$ and A5.

The output of NAND gate 115 feeds inverters 120 and 121, which are in turn connected at their respective positive power supply inputs to lines A2 or $\overline{A2}$. The gates of drain-grounded n-channel transistors 130 are connected to lines A2 and $\overline{A2}$, and the sources of these n-channel transistors are connected to the output of inverter 120. Each of the "n" outputs of inverters 120 or 121 are in turn connected to inverters 120' or 121'. The same basic scheme is then repeated to produce the aforementioned COLSELECT signals. NAND gate 115 can be programmed $\overline{A3}\ \overline{A4}\ \overline{A5}$, A3 $\overline{A4}\ \overline{A5}$, $\overline{A3}$ A4 $\overline{A5}$, A3 A4 $\overline{A5}$, $\overline{A3}\ \overline{A4}$ A5, A3 $\overline{A4}$ A5, $\overline{A3}$ A4 A5 and A3 A4 A5. CARRYIN and CARRYOUT signals are connected together on side-by-side cells and strapped to $V_{cc}$ on the ends of the first and last cells (not shown).

Figure 5:
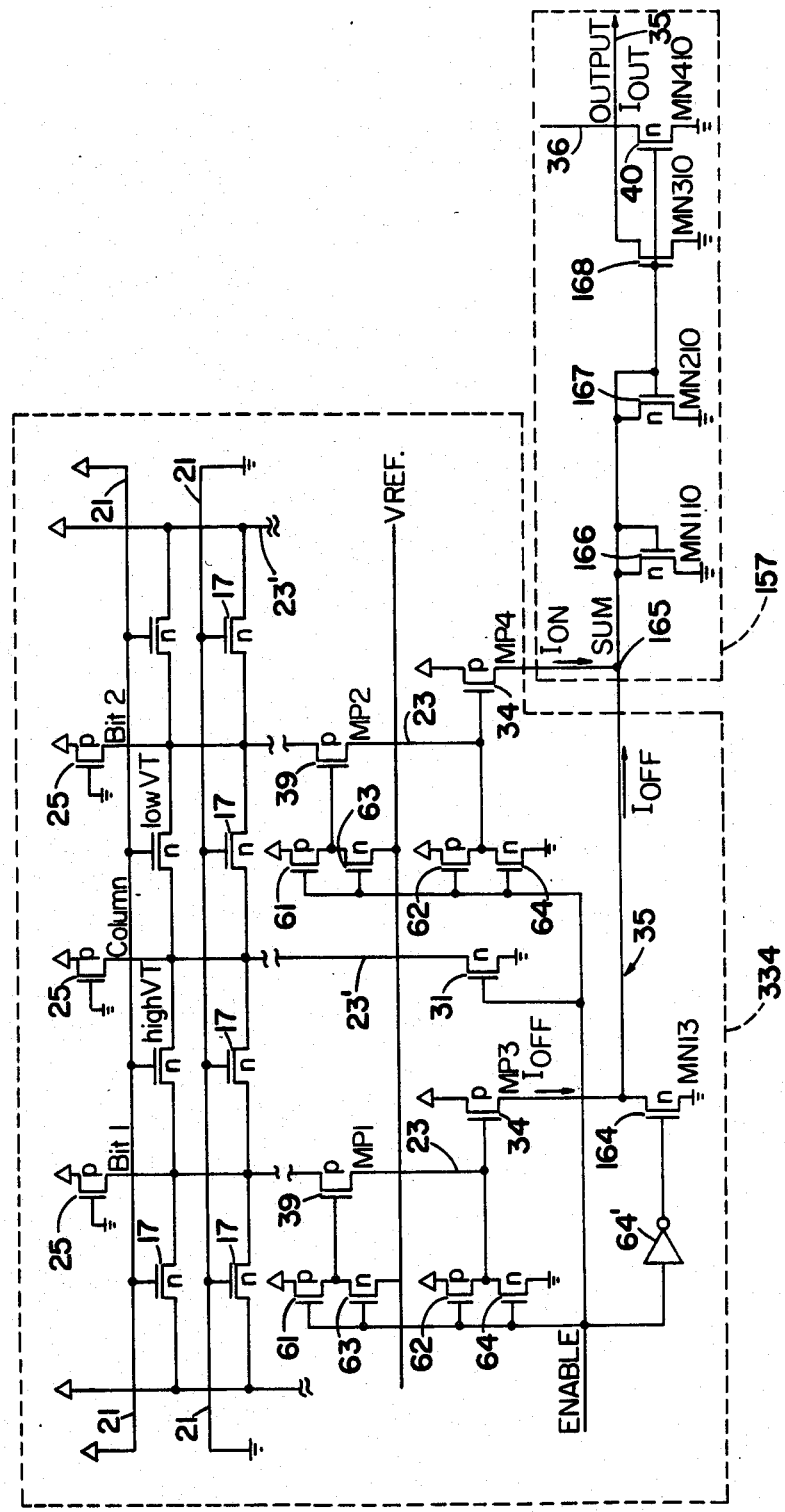
FIG. 5 is a circuit arrangement to establish an effective slew rate during state changes of the output lines.

It follows that the arrangement shown in FIG. 5 will cause a current $I_{ON}$ to flow through MP3 or MP4 to one of OUTPUT lines 35 and 36, if the selected array transistor 17 is a low $V_T$ device. $I_{OFF}$ can be defined as the current through one of OUTPUT lines 35 and 36, if the selected array transistor 17 is a high VT device.

FIG. 5 shows how to insure the establishment of an effective slew rate during state changes of output lines 35 and 36 between high and low states. One row of transistors 17 is tied high and the remainder of rows of transistors 17 are tied low, in this example. The ENABLE line shown can carry a chip-enable or ROM-enable signal. When enable is low, the gates of transistors MP1, MP2, MP3 and MP4 are held high, maintaining them in off condition.

The arrangement in FIG. 5 includes an inverter 64' with its input connected to the gate of transistor 64 and connected at its output to the gate of transistor 164 (MN13) which is drain connected to the drains of p-channel transistors 34 including MP3 and MP4 at SUM node 165. This node 165 is in turn connected to the drains and gates of n-channel transistors 166 and 167 (respectively MN110 and MN210) and the gates of n-channel transistors 168 (MN310) and 40 (MN410).

With ENABLE low, MN110, MN210 and MN310 are turned off by transistor 164 (MN13) holding the SUM node 165 at ground.

With ENABLE in FIG. 5 being high, the current $I_{OFF}$ will flow through transistor MP3 into transistors MN110 and MN210. Also, the current $I_{ON}$ will flow through transistor MP4 into transistors MN110 and MN210. Thus, $I_{ON}+I_{OFF}$ flow through transistors MN110 and MN210.

Transistors MN110, MN210, MN310 & MN410 are identical, causing the current through MN310 to be reduced to $(I_{ON}+I_{OFF})/2$.

Transistors MN310 & MN410 are connected to OUTPUT lines 35 and 36 as noted, and according to one embodiment of this invention, a total of eight identical devices, such as transistors MN310 and MN410, two of them, shown in FIG. 5 with their gates tied to the gate of transistor MN110, will be tied to corresponding ones of OUTPUT lines, such as 35 and 36.

Well-known bit-sense circuit 337 in FIG. 6 draws either ION or IOFF, depending upon whether a high or low VT device has been selected. If bit sense circuit 337 produces ION, IOUT=ION−(IOFF+ION)/2 or more particularly IOUT=$[(I_{ON}-I_{OFF})/2]$. If circuit 337 produces IOFF, IOUT=IOFF−(ION+IOFF)/2. Thus, IOUT=−$[(ION-IOFF)/2]$. Accordingly a sink or source current of magnitude (ION−IOFF)/2 in or out of OUTPUT node 165 is produced, depending upon the $V_T$ state of the transistor 17 selected.

FIG. 7 shows the portion of circuitry 13 for applying VREF to OUTPUT lines 35 and 36. When a p-channel cascode transistor device 39 (MP1) is active, VREF is applied to its gate. Transistor 64 (MN4) is n-channel and serves as a current source. Output transistor device 34 (MP3) is p-channel device. Transistors 39 and 64 exhibit considerable device variation.

If MP1 is on the more conductive side of its range, node A therebetween will be too high to effectively access both high and low VT output devices such as transistor 34 (MP3). As a result, currents IOFF and ION through device MP3 will both be small and not greatly different.

If MP1 is on the less conductive side of its range, and MN4 is on the more conductive side of the range, node A will be relatively low in voltage for accessing both high and low VT devices MP3. Currents ION and IOFF through MP3 will again be relatively low.

It is important to maintain a substantial difference between IOFF and ION. In particular, the charging current to output node 165 is to be plus or minus (ION−IOFF)/2.

Accordingly, VREF is to be a higher voltage in the case of a highly conductive MP1 and low MN4, and a lower voltage in the case of a low conductive MP1 and highly conductive MN4.

FIG. 8 shows a simple circuit 101 including p-channel transistor 102 in series with n-channel transistor 103 with their respective gates held to VREF therebetween. This circuit is able to produce a VREF equal to the trip point of output inverter including MP1 and MN4. VREF will rise in value as the p-channel of transistor 102 becomes more conductive and will diminish in value as the n-channel of transistor 103 becomes more conductive.

Figure 9:
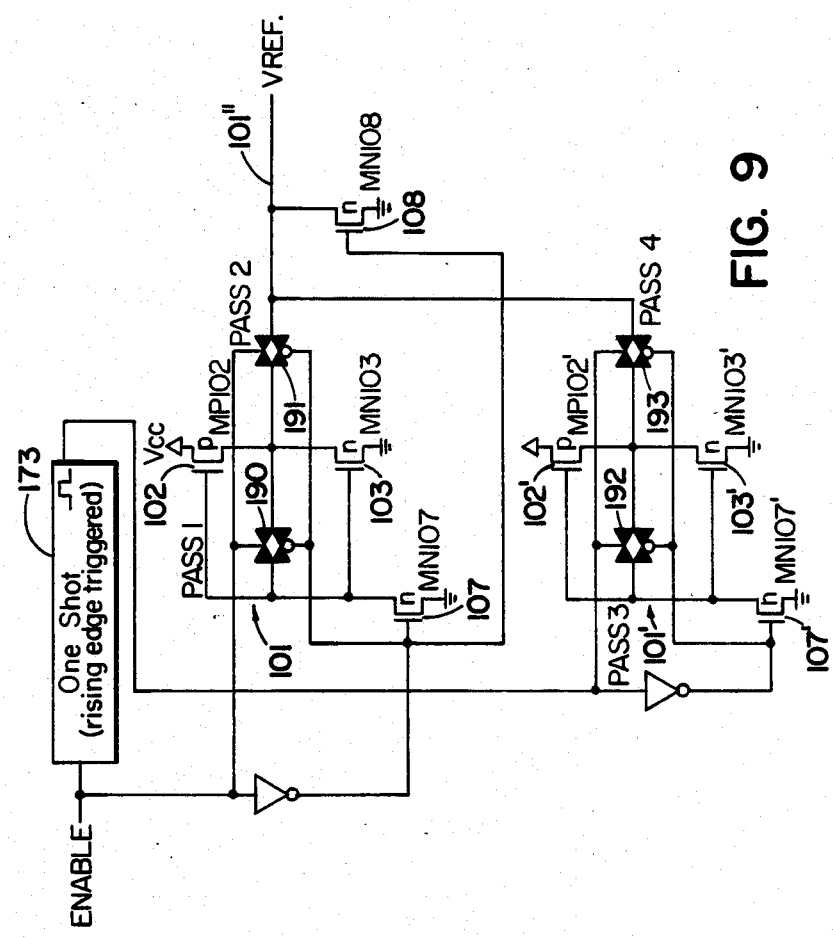
FIG. 9 shows a VREF establishment arrangement according to the invention herein.

The circuit of FIG. 8, however, draws an unacceptable amount of power during deselect. Accordingly, the arrangment of FIG. 9 is employed, helping to limit power consumption during deselect. This circuit includes a rising-edge triggered one shot 173 to drive a parallel circuit 101' to shorten the time to drive VREF to its intended level.

During deselect, respective circuits 101 and 101' are isolated from the output connection 101" for VREF. In particular, an ENABLE-high signal closes transfer gates 190, 191, 192 and 193 (respectively PASS1, PASS2, PASS3 and PASS4). Transfer gates PASS3 and PASS4 are of course subject to control by rising-edge triggered one-shot 173, which produces a high going pulse and causes MP102' and MN103' to set up at an inverter trip point.

In this arrangement, MP102, MN103, MN107, PASS1 and PASS2 are relatively small devices. With respect thereto, MP102', MN103', MN107', PASS3 and PASS4 are relatively large devices. When the ENABLE pulse goes low, PASS3 and PASS4 are turned-off, and the gates of transistors 102' and 103', i.e. MP102' and MN103' respectively, are held low by transistor 107' (MN107'). Whenever ENABLE is low, transistor 108 (MN108) holds VREF to ground to prevent its floating.

The above may lead others skilled in the art to develop versions of the above, which nonetheless fall within the scope of the invention. Accordingly, attention to the claims which follow is urged, as these express the metes and bounds of the invention with particularity.

What is claimed is:

1. A ROM memory circuit, including
   an array of row lines (21);
   an array of bitlines (23);
   an array of column lines (23'); and
   a first plurality of transistors (17), each having a gate connected to row line (21) and a source-drain path connected between one of said column lines (23') and one of said bit lines (23), and serving to slew, i.e. adjust voltage on, said bit line (23);
   at least one output line (35,36); and
   means for selectively connecting one of said bitlines (23) to said output line (35,36);
   wherein:
   said means (FIG. 7) comprises an amplifier (39) having a gate selectively connected to a reference voltage and an input connected to said one of said bit lines (23) and a p-channel transistor (34) having a gate connected to an output terminal of said amplifier (39) and a drain connected to and driving said output line (35,36), whereby capacitance on the output line (35,36) is isolated from capacitance on the selected bitline (23) and said first plurality of transistors (17) need slew only said bitlines (23) and not said output line (35, 36);
   a plurality of column select lines (30') are provided, which carry COLSELECT signals and alternate with said bitlines;
   a selected one of said bitlines (23) is set high whenever either, but not both, of the adjacent COLSELECT lines is high;
   said circuit further comprises bit select circuitry (91, 95) effective for performing a logical OR between two adjacent column select signals;
   said bit select circuitry (91, 91', 95) for each bitline is implemented using only first (95), second (96) and third (97) transistors, said second (96) and third (97) transistors being series-connected and having their gates commonly connected to the complement of a first COLSELECT signal, the remaining terminal of said third transistor (97) being tied to a power supply potential and the remaining terminal of said second transistor (96) being connected to a second COLSELECT signal,
   said first transistor (95) having a gate connected to the complement of said second COLSELECT signal, one terminal connected to said power supply potential and one terminal connected to the junction of said second (96) and third transistors (97), said junction being further connected to an output line which provides a BITSELECT signal.

2. The circuit of claim 1, further characterized in that (FIG. 9)
   the reference voltage (VREF) driving the gate of said amplifier (39) is applied by an inverter (101) with its output shorted to its input.

3. The circuit of claim 1, wherein
   said second transistor (96) is n-channel and said first (95) and third (97) transistors are p-channel.

* * * * *